(12) United States Patent
Sjöström et al.

(10) Patent No.: US 7,023,053 B2
(45) Date of Patent: Apr. 4, 2006

(54) DIFFERENTIAL TRANSISTOR PAIR

(75) Inventors: Johan Sjöström, Tyresö (SE); Torkel Arnborg, Stockholm (SE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/848,811

(22) Filed: May 19, 2004

(65) Prior Publication Data
US 2004/0212020 A1    Oct. 28, 2004

Related U.S. Application Data

(63) Continuation of application No. PCT/SE02/02243, filed on Dec. 5, 2002.

(30) Foreign Application Priority Data
Dec. 6, 2001 (SE) .................................... 0104116

(51) Int. Cl.
*H01L 29/72* (2006.01)

(52) U.S. Cl. .................. 257/368; 257/575; 257/369; 257/370

(58) Field of Classification Search .................. 257/368
See application file for complete search history.

(56) References Cited

U.S. PATENT DOCUMENTS

| 4,163,244 A | * | 7/1979 | Ragonese et al. | ............ 257/575 |
| 6,335,655 B1 | | 1/2002 | Yamamoto | ................... 327/552 |
| 6,345,178 B1 | | 2/2002 | Kaapala | ...................... 455/326 |

FOREIGN PATENT DOCUMENTS

JP    9181191    7/1997

* cited by examiner

*Primary Examiner*—Edward Wojciechowicz
(74) *Attorney, Agent, or Firm*—Baker Botts L.L.P.

(57) ABSTRACT

A differential transistor pair comprises a plurality of transistor cells in a substrate. Each cell comprises first drain regions at the respective edge of the cell, and a second drain region in between. Source regions are located between the respective first drain region and the second drain region. First gate regions are located between the respective first drain region and the source regions, and second gate regions are located between the source regions and the second drain region. The first drain regions of all cells are interconnected to a common first drain terminal, and the second drain region of all cells are interconnected to a common second drain terminal. The first gate regions of all cells are interconnected to a common first gate terminal, and the second gate regions of all cells are interconnected to a common second gate terminal.

5 Claims, 1 Drawing Sheet

DIFFERENTIAL TRANSISTOR PAIR

CROSS REFERENCE TO RELATED APPLICATION

This application is a continuation of copending International Application No. PCT/SE02/02243 filed Dec. 5, 2002 which designates the United States, and claims priority to Swedish application no. 0104116-9 filed Dec. 6, 2001.

TECHNICAL FIELD OF INVENTION

The present invention generally relates to RF amplifiers and more specifically to a differential transistor pair.

BACKGROUND OF THE INVENTION

Power amplifiers using RF power transistors suffer from a reduction in gain with increasing frequency due to parasitic effects in the transistors. One of the most limiting parasitic effects in large power transistors used at high frequencies is the so called "effective common-lead inductance", i.e. the magnetic coupling between the input and output loops of the transistor, causing inductive feedback. A number of techniques can be used to reduce that coupling. One can e.g. use substrate vias, a conductive substrate, or a large number of bond wires connected to ground. A differential amplifier is another option, which also suppresses even harmonics, and has doubled input and output impedance levels.

Such power amplifiers are commonly built from two discrete transistors, in separate packages, or on separate dies in the same package, or one the same die but located in two separate groups.

FIG. 1 is a schematic cross-sectional view of an embodiment of a known differential transistor pair.

Two discrete LDMOS RF power transistors 1, 2 are located on a common package ground plane 3.

In a manner known per se, each transistor 1, 2 comprises in a substrate 4 and 5, respectively, a plurality of transistor cells C1, C2, each comprising a source region, a gate region, and a drain region.

Each such cell C1, C2 comprises a source region S, a gate region G and a drain region D as illustrated more in detail above the transistor 1 in FIG. 1. In a manner known per se, the source region S is connected to a substrate contact SC via a metal clamp C.

In each transistor 1, 2, all gate regions are coupled in parallel and connected to a common gate terminal (not illustrated). Moreover, all drain regions are coupled in parallel and connected to a common drain terminal (not illustrated) in each transistor 1, 2.

The source regions of the transistors 1, 2 are all interconnected via the heavily doped substrates 4, 5 and the ground plane 3.

In operation, RF current will flow from the gate region G and the drain region D of transistor 1 through the channel of transistor 1, through the source region S of transistor 1 and into the metal clamp C of transistor 1, through the substrate contact SC of transistor 1, through the substrate 4 of transistor 1, through the ground plane 3 and into the substrate 5 of transistor 2, through the substrate contact (not shown) of transistor 2, through the metal clamp (not shown) of transistor 2 and into the source region (not shown) of transistor 2, through the channel (not shown) of transistor 2 and into the gate region (not shown) and the drain region (not shown) of transistor 2 as indicated by line 6 in FIG. 1.

Since the effective impedance between the source regions of the transistors 1 and 2 is non-zero at RF and common to both input and output loops of the transistors, the gain will be reduced due to feedback in the known differential transistor pair.

SUMMARY OF THE INVENTION

The object of the invention is to bring about a differential transistor pair with a low effective impedance between the source regions of the transistors.

This is attained in that the differential transistor pair according to the invention comprises a plurality of transistor cells in a substrate. Each cell comprises first drain regions at the respective edge of the cell, and a second drain region between the first drain regions. Source regions are provided between the respective first drain region and the second drain region. First gate regions are provided between the respective first drain region and the source regions, and second gate regions are provided between the source regions and the second drain region. The first drain regions of all cells are interconnected to a common first drain terminal. The second drain region of all cells are interconnected to a common second drain terminal. The first gate regions of all cells are interconnected to a common first gate terminal, and the second gate regions of all cells are interconnected to a common second gate terminal.

In the differential transistor pair according to the invention, RF currents will flow through the differential pair without passing through the bulk substrate.

BRIEF DESCRIPTION OF THE DRAWING

The invention will be described more in detail below with reference to the appended drawing on which FIG. 1, described above, is a schematic cross-sectional view of a known differential transistor pair.

DESCRIPTION OF THE INVENTION

Figure 2:
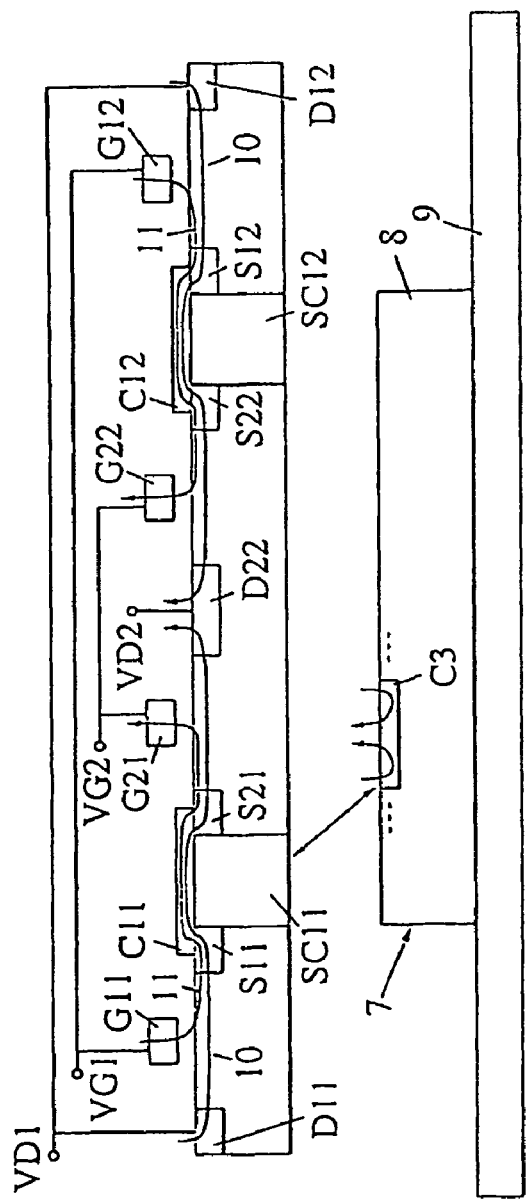
FIG. 2 is a schematic cross-sectional view of an embodiment of a differential transistor pair in accordance with the invention.

FIG. 2 is a schematic cross-sectional view of an embodiment of a differential LDMOS transistor pair 7 in accordance with the invention.

In accordance with the invention, cells of two LDMOS transistors are merged two and two into a plurality of merged cells C3 in one and the same substrate 8 on a ground plane 9.

Figure 1:
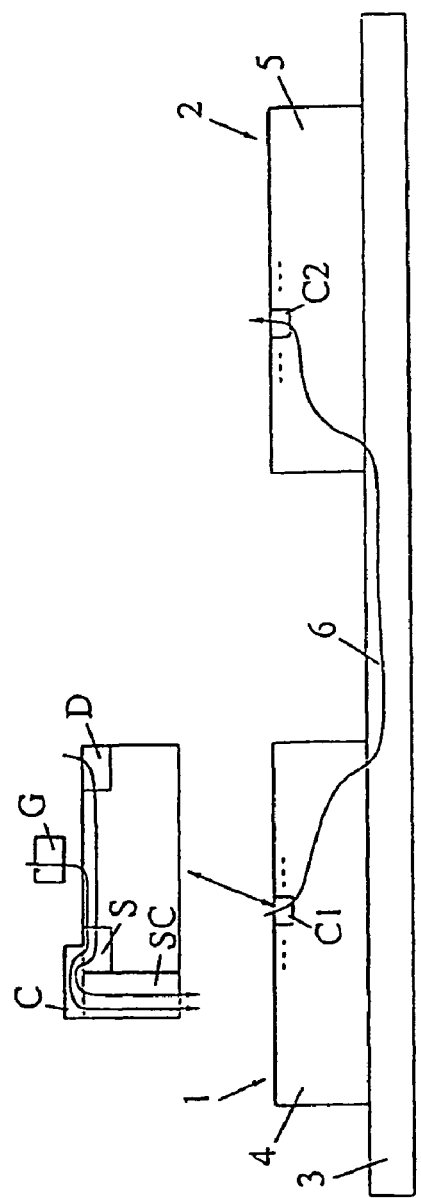

The merging can be accomplished by mirroring e.g. each transistor cell C1 in FIG. 1 at its source contact edge such that each combination of each transistor cell C1 and its mirrored version has a common substrate contact in the middle, sources on either side of the common substrate contact, interconnected via a common metal clamp, drains at the edges, and gates in between. Each such combination of two cells is then mirrored at one drain edge such that each new combination of four cells has drains at the edges, a common drain in the middle, interconnected sources between the edge drains and the common drain, first gates between the edge drains and the interconnected sources, and second gates between the interconnected sources and the common drain.

In FIG. 2, an embodiment of such a merged cell C3 according to the invention is illustrated more in detail above the transistor pair 7.

The merged cell C3 comprises a drain region D11 at one edge of the cell and a drain region D12 at the other edge of the cell. The edge drain regions D11, D12 and all drain regions in the differential transistor pair 7 that correspond to those edge drain regions D11, D12 are interconnected to a common edge drain terminal VD1.

A central drain region D22 is located between the edge drain regions D11, D12. The central drain region D22 and all drain regions in the differential transistor pair 7 that correspond to that central drain region D22 are interconnected to a common central drain terminal VD2.

One common substrate contact SC11 with source regions S11 and S21 on either side interconnected via a common metal clamp C11 is located between the edge drain region D11 and the central drain region D22. Another common substrate contact SC12 with source regions S12 and S22 on either side interconnected via a common metal clamp C12 is located between the edge drain region D12 and the central drain region D22.

The common substrate contacts SC11, SC12 and all other substrate contacts in the differential transistor pair 7 that correspond to those substrate contacts SC11, SC12 are interconnected via the substrate 8 and the ground plane 9.

First gate regions G11, G12 are located between the edge drain regions D11, D12 and the common substrate contacts SC11, SC12. The first gate regions G11, G12 and all gate regions in the differential transistor pair 7 that correspond to those first gate regions G11, G12 are interconnected to a common first gate terminal VG1.

Second gate regions G21, G22 are located between the common substrate contacts SC11, SC12 and the central drain region D22. The second gate regions G21, G22 and all gate regions in the differential transistor pair 7 that correspond to those second gate regions G21, G22 are interconnected to a common second gate terminal VG2.

In operation, RF currents will flow within the cells from the edge drain regions D11, D12 and the gate regions G11, G12 via the source regions S11, S12 into the common metal clamps C11, C12, through the source regions S21, S22 and to the central drain region D22 and the gate regions G21, G22 as indicated by lines 10 and 11 in FIG. 2.

Thus, RF currents will not flow through the substrate 8 and the ground plane 9.

Hereby, the source impedance of the differential pair according to the invention will be smaller and, consequently, the gain will be higher than in the known differential pair according to FIG. 1.

It is to be understood that the invention is not restricted to differential LDMOS transistor pairs but is equally applicable to bipolar junction transistors (BJTs). In a differential BJT pair (not shown), there would be collector regions that correspond to the drain regions in FIG. 2, emitter regions that correspond to the source regions in FIG. 2, and base regions that correspond to the gate regions in FIG. 2.

We claim:

1. A differential transistor pair comprising a first and second transistor, said first and second transistors comprising at least one transistor cell provided in a substrate, the at least one cell comprising:

a first and a second drain/collector region belonging to the first transistor of said differential transistor pair and arranged separated from each other, a third drain/collector region belonging to the second transistor of said differential transistor pair, and arranged between said first and second drain/collector regions, a first source/emitter region arranged between said first drain/collector region and said third drain/collector region, and a second source/emitter region arranged between said second drain/collector region and said third drain/collector region, said source/emitter regions being common to both transistors of the differential transistor pair, a first and a second gate/base region belonging to the first transistor of said differential transistor pair, said first gate/base region being arranged between said first drain collector region and the first source/emitter region, and said second gate/base region being arranged between said second drain/collector region and the second source/emitter region, and a third and a fourth gate/base region belonging to the second transistor of said differential transistor pair, said third gate/base region being arranged between said third drain/collector region and the first course/emitter region, and said fourth gate/base region being arranged between said third drain/collector region and the second source/emitter region.

2. The differential transistor pair as claimed in claim 1, comprising a plurality of transistor cells, wherein the first and second drain/collector regions of each of said plurality of transistor cells of said first transistor are interconnected to a common first drain/collector terminal, the third drain/collector region of each of said plurality of transistor cells of said second transistor are interconnected to a common second drain/collector terminal, the first and second gate/base regions of each of said plurality of transistor cells of said first transistor are interconnected to a common first gate/base terminal, and the third and fourth gate/base regions of each of said plurality of transistor cells of said second transistor are interconnected to a common second gate/base terminal.

3. The differential transistor pair as claimed in claim 1, for use in RF power amplifier applications.

4. The differential transistor pair as claimed in claim 1, wherein said differential transistor pair is a differential LDMOS transistor pair or a differential bipolar junction transistor pair.

5. The differential transistor pair as claimed in claim 1, wherein each of said first and second transistors has a finger type layout.

* * * * *